(12) United States Patent
Tezuka et al.

(10) Patent No.: US 12,032,298 B2
(45) Date of Patent: Jul. 9, 2024

(54) MEASUREMENT TOOL AND METHOD FOR LITHOGRAPHY MASKS

(71) Applicant: Intel Corporation, Santa Clara, CA (US)

(72) Inventors: Yoshihiro Tezuka, Tsukuba (JP); Adam Seeger, Palo Alto, CA (US); Ping Qu, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 344 days.

(21) Appl. No.: 17/482,507

(22) Filed: Sep. 23, 2021

(65) Prior Publication Data

US 2022/0011679 A1    Jan. 13, 2022

(51) Int. Cl.
*G03F 7/00* (2006.01)
*G01N 21/956* (2006.01)

(52) U.S. Cl.
CPC ........ *G03F 7/70608* (2013.01); *G01N 21/956* (2013.01); *G03F 7/70716* (2013.01); *G03F 7/7085* (2013.01); *G01N 2021/95676* (2013.01)

(58) Field of Classification Search
CPC ............ G03F 7/70608; G03F 7/70716; G03F 7/7085; G03F 1/44; G03F 1/84; G01N 21/956; G01N 2021/95676
See application file for complete search history.

(56) References Cited

U.S. PATENT DOCUMENTS

| 9,942,474 B2* | 4/2018 | Venkataraman ..... H04N 5/2226 |
| 2006/0228975 A1* | 10/2006 | Miura ................. B41J 11/0021 445/24 |
| 2011/0116077 A1 | 5/2011 | Chuang et al. |
| 2013/0250286 A1 | 9/2013 | Han |

(Continued)

FOREIGN PATENT DOCUMENTS

CN        111103757 A       5/2020

OTHER PUBLICATIONS

International Search Report issued for the corresponding International patent application No. PCT/US2022/038743, dated Nov. 23, 2022, 10 pages (for informational purposes only).

(Continued)

*Primary Examiner* — Tarifur R Chowdhury
*Assistant Examiner* — Carlos Perez-Guzman
(74) *Attorney, Agent, or Firm* — VIERING, JENTSCHURA & PARTNER MBB (57) ABSTRACT

The present disclosure is directed to a EUV mask measurement tool having a source assembly that generates a high power extreme ultraviolet (EUV) light beam, a detector assembly including a projection optics system and a CCD camera, a stage for supporting a patterned mask, the pattern mask including a plurality of predetermined test sites, a processor programmed to determine a site specific best focus plane for each of the plurality of predetermined test sites on the patterned mask, and a program module to generate instructions to move the stage to the best focus plane for (Continued)

each of the plurality of predetermined test sites on the patterned mask. In addition, a method for generating a site specific best focus plane for each of the plurality of predetermined test sites using a continuous scanning process that provides a continuous image output from the test site.

19 Claims, 4 Drawing Sheets

(56) References Cited

U.S. PATENT DOCUMENTS

| | | |
|---|---|---|
| 2013/0265557 A1 | 10/2013 | Chilese |
| 2016/0274029 A1 | 9/2016 | Bol |
| 2017/0256045 A1 | 9/2017 | Miyai et al. |
| 2020/0041915 A1* | 2/2020 | Yu .................... G03F 7/2004 |
| 2020/0096862 A1* | 3/2020 | Tolani ................ G01N 23/2255 |
| 2021/0033978 A1* | 2/2021 | Kooiman ............ G03F 7/70608 |
| 2023/0008957 A1* | 1/2023 | Huang ................ G03F 7/2004 |
| 2023/0350308 A1* | 11/2023 | Pawlowski ........ G01N 21/9501 |

OTHER PUBLICATIONS

Hellweg, Dirk et al., "Actinic review of EUV masks: performance data and status of the AIMS EUV system", Proc. SPIE 10143, Extreme Ultraviolet (EUV) Lithography VIII, 101430J, Mar. 24, 2017, 13 pages.

Miyai, Hiroki et al., "Actinic patterned mask defect inspection for EUV lithography", Proc. SPIE 11148, Photomask Technology 2019, 111480W, Nov. 25, 2019, 10 pages.

* cited by examiner

MEASUREMENT TOOL AND METHOD FOR LITHOGRAPHY MASKS

BACKGROUND

As scaling continues further into the submicron regime and extreme ultraviolet (EUV) lithography technology enters high volume manufacturing, the use of EUV lithography masks is at the forefront of semiconductor processing. EUV typically denotes soft x-rays with wavelengths between 124 and 10 nm or photon energies between 10 eV and 124 eV. There is, however, a need for actinic patterned mask inspection, since the patterns on wafers are reproductions of those on photomasks. The quality of the wafer patterns, as measured by linewidth control, overlay, and defects, is strongly affected by the quality of the corresponding parameters on the masks. Linewidth variations on the reticles ultimately result in linewidth variations on the wafer. Mask registration errors contribute to overlay errors. Defects on the reticle may result in a nonworking die. Consequently, masks are critical components of EUV lithographic technology.

A robust EUV mask infrastructure will play an important role in the successful introduction of EUV into high-volume manufacturing by providing mask shops with actinic tools with inspection capabilities. Actinic inspection of masks in computer chip manufacture refers to inspecting the mask with the same wavelength of light used by a lithography system for a patterning step during the manufacturing process.

There are actinic metrology platforms based on aerial imaging technology and other technologies that have been developed that may fulfill the mask shop requirements for actinic defect review and repair verification. For example, a critical dimension scanning electron microscope (CD-SEM) is a dedicated tool that may be used for measuring the dimensions of fine patterns. In semiconductor manufacturing, CD-SEM may be used as a wafer inspection tool for inspecting the various features of the semiconductor devices, as well as being used for inspecting EUV lithography masks. However, the critical dimensions (CD) of a mask measured by CD-SEM may not correlate well with the CD of a wafer after printing by a EUV exposure tool. Also, CD-SEM may not fully capture sidewall angles that may be associated with undercuts and surface roughness.

Other mask defect inspection and review tools, e.g., AIMS™, may have the capability of providing a full emulation of the scanner imaging process (e.g. automated mask handling, etc.) and use aerial imaging through focus stack acquisition for the full review of a structure and any defect printing behavior. However, the generation of CD measurements by AIMS-like tools may be slow, even though the resulting data may correlate well with the CD of the wafer.

Presently, to improve throughput, a combination of CD-SEM data at multiple sites and AIMS data at a few selected sites have been used to qualify mask CD uniformity. When the CD-SEM data and AIMS data do not correlate sufficiently, additional AIMS data may need to be collected, which may significantly delay a qualification test. Accordingly, with the need for EUV masks to be defect-free, or at least have minimal defects, there is a need for improved EUV mask inspection tools and methods for mask inspections.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to performing continuous best focus plane scans that allow for multiple individual best focus plane settings, i.e., at different heights, for a plurality of predetermined test sites. A present EUV measurement tool may have a source assembly that generates a high power extreme ultraviolet (EUV) light beam, a detector assembly comprising a projection optics system and a CCD camera, a stage control system, a stage for supporting a patterned mask, the pattern mask may have a plurality of predetermined test sites, a processor programmed to determine a site specific best focus plane for each of the plurality of predetermined test sites on the patterned mask using a single scan that provides a continuous image output from the test site, and a program module to generate instructions to move the stage to the best focus plane for each of the plurality of predetermined test sites on the patterned mask to generate critical dimension data.

In another aspect, a method for mask measurements pursuant to the present disclosure may include providing a EUV light source with a focal field (i.e., a field of view), providing a detector assembly, providing a patterned EUV mask on a stage, moving the stage to align the focal field with specific coordinates for a test site selected from a plurality of predetermined test sites, determining a best focus plane for the test site from a scan taken as the stage moves, wherein the scan provides a continuous image output from the test site, moving the stage to a stationary position at the best focus plane, and obtaining an actinic critical dimension measurement at the test site by capturing a static image.

In yet another aspect, a present EUV inspection method may include providing a patterned mask on a movable stage, in which the patterned mask has a plurality of predetermined test sites and pre-selected calibration sites, generating best focus planes for the pre-selected calibration sites using a step and repeat scanning process, generating a site specific best focus plane for each of the plurality of predetermined test sites using a continuous scanning process that provides a continuous image output from the predetermined test site, and obtaining actinic critical dimension measurements at each of the plurality of predetermined test sites by capturing a static image using the site specific best focus plane for each of the plurality of predetermined test sites.

It is typical for inspections to measure the CDs of selected features of an EUV mask to use an inspection "recipe" that provides, among other things, the predetermined test sites on the EUV mask (i.e., image fields for measurement). The number of such test sites can vary greatly, with a common number being approximately 100 to 1000.

Figure 1:
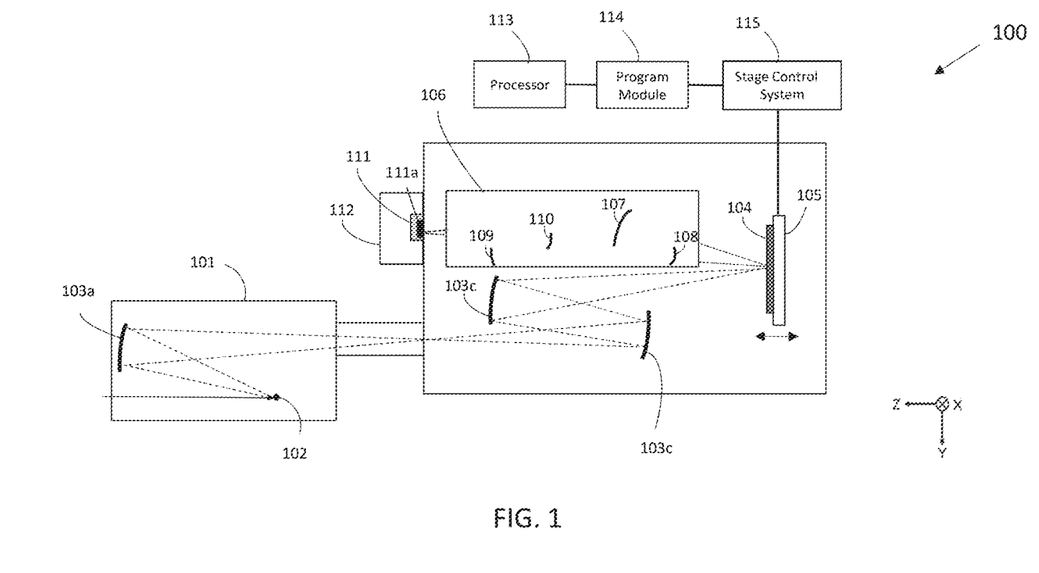
FIG. 1 shows a schematic side view of an exemplary actinic CD measurement tool according to an aspect of the present disclosure.

According to the present disclosure, FIG. 1 shows a schematic side view of the present measurement tool 100. A EUV light may be emitted from source assembly 101 that includes a laser produced plasma (LPP) source 102. The EUV light is collected from a collector mirror 103a and reflected and focused through mirrors 103b and 103c. The EUV light may be illuminated onto a mask 104 sitting on a mask stage 105. The EUV light may be scattered by patterns on the mask 104 and maybe projected by a projection optics system 106 with an exemplary total magnification of approximately 600×~1200×, which may, for example, be obtained by four mirrors 107, 108, 109, and 110.

The reflected EUV light may be received onto a back-illuminated complementary metal-oxide-semiconductor (CMOS) sensor 111, with a shutter 111a, that are components of a detector assembly 112. In an aspect, the detector assembly 112 is a charge-coupled device (CCD) camera. While not shown, the present EUV measurement tool 100 and its subcomponents will be coupled to a processor 113 or computing device for control of the various functions including a program module 114 configured to generate instructions to a stage control system 115 that moves the stage to the best focus plane for each of the plurality of predetermined test sites on the patterned mask to generate critical dimension data.

In an aspect of the present disclosure, a laser produced plasma (LPP) 101 may be used as a source of a high power EUV light; for example, a 13 nm $CO_2$—Sn LPP that is suitable for high-volume manufacturing semiconductor lithography. The LLP technology and key components may include a high-power carbon dioxide ($CO_2$) laser with 15 ns pulse duration, a short wavelength solid-state pre-pulse laser with 10 ps pulse duration, a highly stabilized small droplet (DL) target, a precise DL-laser shooting control system and unique debris mitigation technology with a magnetic field.

In another aspect, a mask stage of a present EUV inspection tool moves to capture images of given specific coordinates on the mask using a CMOS sensor. For each predetermined test site, a stage may have a Z position that gives the best focus plane, which needs to be calibrated before critical dimension images are captured. An accurate best focus plane determination/calibration procedure is typically the most time-consuming step when using a conventional EUV tool since it may require capturing images at multiple focus planes and comparing the blurry of the images with a step-and-repeat motion of the stage in a Z-direction. According to the present disclosure, however, a mask stage moves in a Z-direction in a continuous motion during the best focus plane search, while processing the continuous image output from a CMOS sensor.

In an aspect, the present CMOS camera may use a rolling shutter or a global shutter. While the majority of CMOS cameras use a rolling shutter, which involves reading out individual rows of pixels, some global shutter CMOS technologies exist. For rolling shutters, a readout process along rows of a CMOS sensor may be an extremely fast process, as each row of the sensor can be read in approximately 10 µs. However, there are often 1000s of rows, this results in total readout times of around 10 milliseconds. By way of comparison, the average human eye blink lasts 100 milliseconds. To further maximize speed and frame rates, each individual row of pixels on the sensor begins the next frame's exposure after completing the readout for the previous frame.

A rolling shutter allows CMOS cameras to operate at high speed, but with a small time delay between each row of the image and an overlapping exposure between image frames. For example, if the image capture using CMOS with a rolling shutter is at a frame rate of 50 fps, more than 1,000 sites per hour is possible even at a stage settling time of 0.1 seconds. However, a present CMOS sensor equipped with a rolling shutter is only available as a back-illuminated sensor for EUV light detection, and the image processing to define a best focus plane from images taken with continuously moving stage may need to compensate for the images within the field of view not being captured at the same timing. For straightforward line and space features, a determination of a best focus plane by standard image processing from the images taken with continuous stage motion is readily done.

For a present camera with a global shutter, it may be able to capture an image of a single point in time across the whole field of the camera's CMOS sensor. In addition, the image processing to identify the best focus plane from multiple images during continuous motion of stage is simple and straightforward since each image is taken exactly at the same timing within the field of view because of the fundamental mechanism of the global shutter. While this shutter mode has no time difference across the image, a charge-coupled device (CCD) may have an inherent disadvantage when it comes to image acquisition speed and frame rate, as the sensor may typically have only a single analog-to-digital converter, with the ultimate speed of global shutter CCD being limited by the rate that individual pixels can be transferred and digitized. The more pixels on the sensor to transfer, the slower the total frame rate, even if the whole frame can be captured at once.

Figure 2:
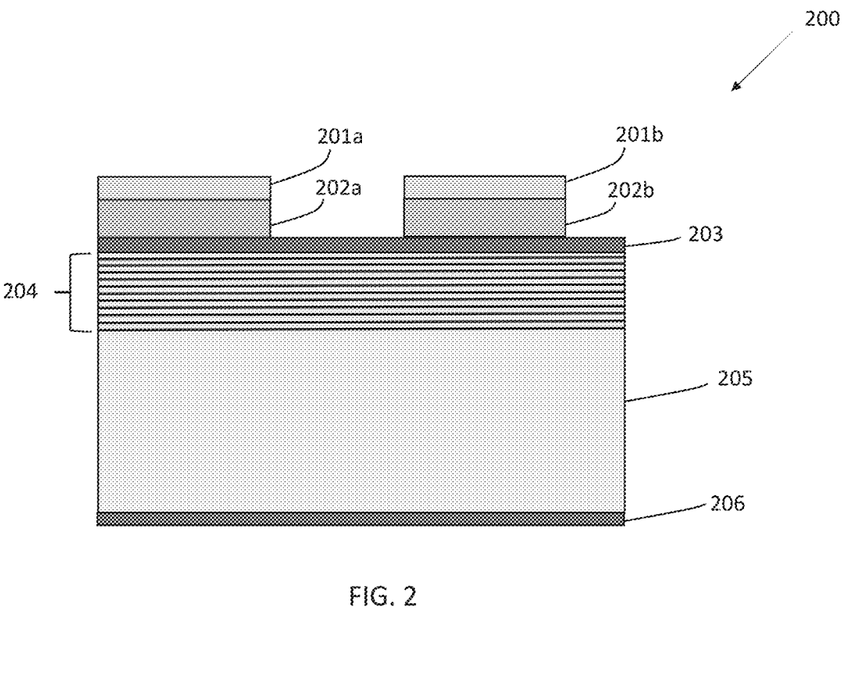
FIG. 2 shows a cross-section view of an exemplary patterned EUV mask according to an aspect of the present disclosure.

For EUV photomask qualification, the need for an actinic review and inspection tool is due to the very nature of EUV light and its reflection process onto EUV optics, as the structure of the reflective multilayer mirror and the substrate can strongly affect printability. As shown in FIG. 2, an exemplary EUV mask 200 may consist of a mirror 204 (e.g., 40 to 50 pairs of alternating layers of silicon and molybdenum) on top of a glass substrate or other low thermal expansion material 205, and a ruthenium-based capping layer 203 and conductive backside coating 206 (e.g., a chrome-based opaque layer) on the glass substrate 205. In addition, there may be patterned lines formed, which are shown as anti-reflective coating (ARC) layer 201a on an absorber layer 202a and ARC layer 201b on an absorber layer 202b; the ARC may be, for example, $HF_xO_y$ or $Si_xO_yN_z$, and absorber layer may be, for example, TaBO, TaBBN or TaN.

Figure 3:
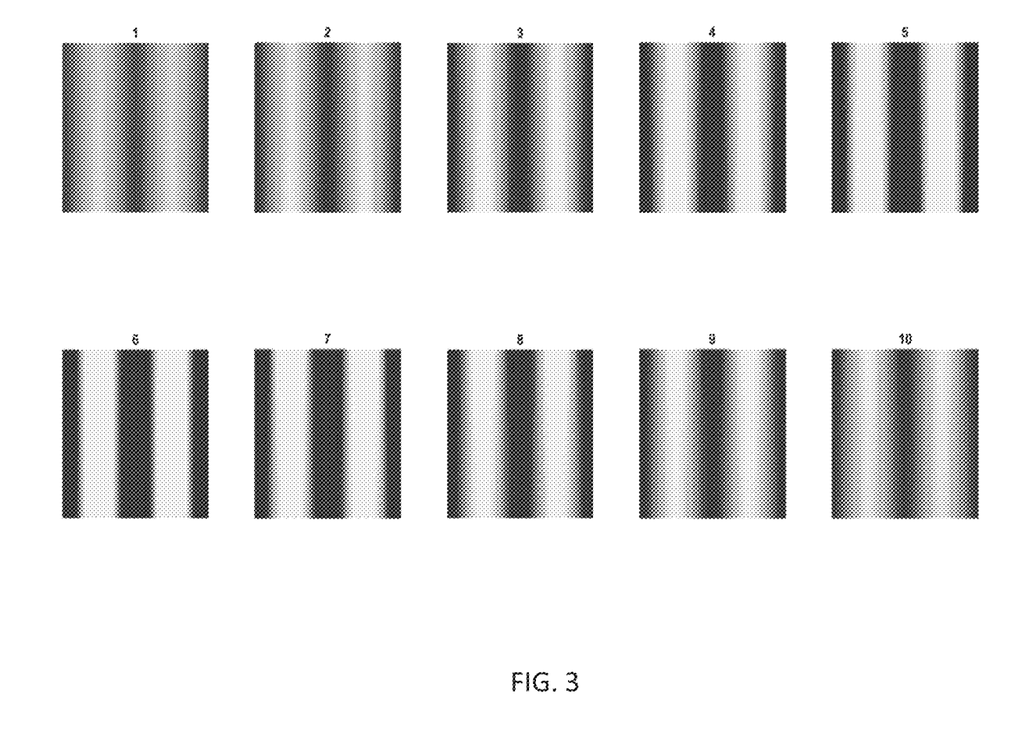
FIG. 3 shows a series of output images from a present CD measurement tool according to an aspect of the present disclosure.

In FIG. 3, in an aspect, a series of exemplary images of two vertical spaces on a EUV mask were generated using a continuous motion of stage in the Z-direction during a scan of one of the predetermined test sites on the EUV mask. A present camera having a back-illuminated CMOS sensor with a rolling shutter was used in accordance with an aspect of the present mask CD inspection tool. In this series of output images generated at the predetermined test site, it may be observed that the image blur is different among images because the Z distance of the mask is different (i.e., taken at different focus planes) as the stage moves. In addition, it may also be observed that image blur within each image may differ as a function of the row in each image because of the timing of the image capture with a rolling shutter, which is moving in a vertical direction in this case. By analyzing/comparing the image blur of the output images, including the rows in each image, the best focus plane may be identified.

As shown in FIG. 3, it appears that the image labeled 6, which is at a 60% position from the "top" (i.e., farthest left in the Z-direction). According to present disclosure, this 60% position may be selected as the best focus plane and the stage may be moved and statically set at this best focus plane to capture one or more static images of CD measurement for the feature(s) at this predetermined test site.

Figure 4:
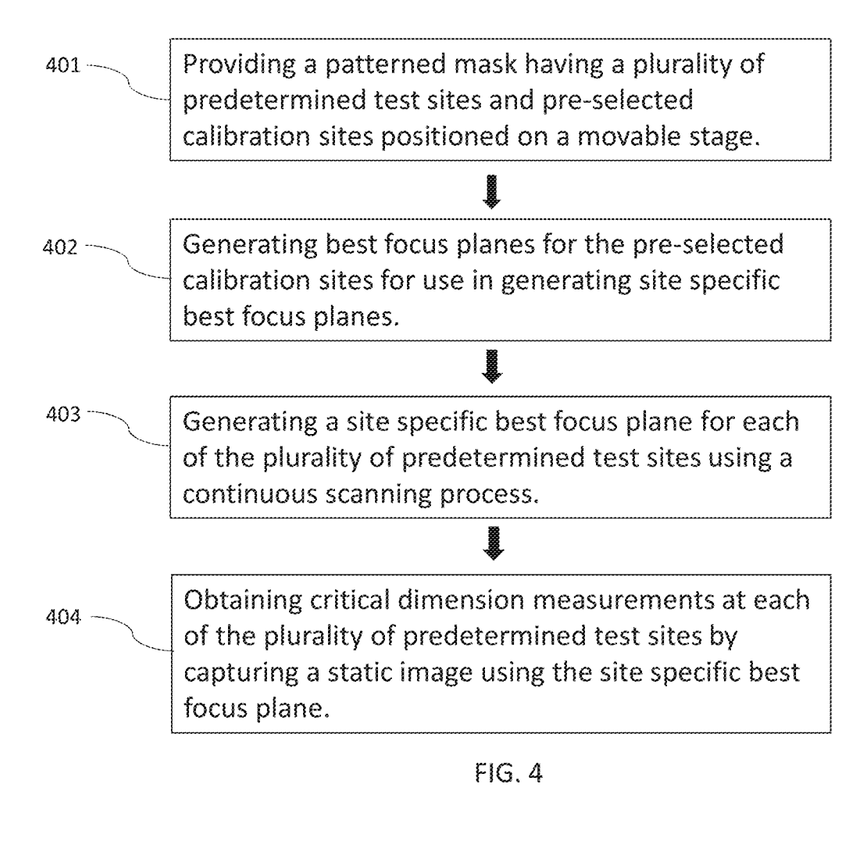
FIG. 4 shows a simplified flow diagram for an exemplary method according to an aspect of the present disclosure.

FIG. 4 shows a simplified flow diagram for an exemplary method for the inspection process for a EUV mask according to aspects of the present disclosure.

The operation 401 may be directed to providing a patterned mask having a plurality of predetermined test sites and pre-selected calibration sites positioned on a movable stage.

The operation 402 may be directed to generating the best focus planes for the pre-selected calibration sites for use in generating site specific best focus planes. Measurements for the best focus plane may first be taken at pre-selected calibration sites (e.g., 3 to 4 sites) to generate a "rough" prediction for the best focal planes of the predetermined test sites. In an aspect, the pre-selected calibration sites may be used to linearly interpolate to estimate the best focus setting for other sites.

The operation 403 may be directed to generating a site specific best focus plane for each of the plurality of predetermined test sites using a continuous scanning process. The continuous scanning process may encompass or pass through the coordinate(s) for the best focus planes for one or more of the pre-selected calibration sites. The movement of the stage may be controlled by a stage control system for the present EUV measurement tool and may be moved at a constant rate in a direction that is aligned with the EUV light source. In an aspect, the range of movement for the stage is a distance of approximately 200 nm.

The operation 404 may be directed to obtaining critical dimension measurements at each of the plurality of predetermined test sites by capturing one or more static images using the site specific best focus plane. The movable stage is set at the generated site specific best focus plane for the predetermined test site before capturing the state image.

The methods and sequence of steps presented above are intended to be exemplary for conducting CD measurement according to the present disclosure. It will be apparent to those ordinary skilled practitioners that the foregoing process operations may be modified without departing from the spirit of the present disclosure.

To more readily understand and put into practical effect the present measurement tool and methods, particular aspects will now be described by way of examples. For the sake of brevity, duplicate descriptions of features and properties may be omitted.

EXAMPLES

Example 1 provides a measurement tool including a source assembly that generates a high power extreme ultraviolet (EUV) light beam, a detector assembly including a projection optics system and a charge-coupled device (CCD) camera, a stage control system, a stage for supporting a patterned mask, the pattern mask including a plurality of predetermined test sites, a processor configured to determine a site specific best focus plane for each of the plurality of predetermined test sites on the patterned mask using a single scan that provides a continuous image output from the test site, and a program module to generate instructions to move the stage to the best focus plane for each of the plurality of predetermined test sites on the patterned mask to generate critical dimension data.

Example 2 may include the measurement tool of example 1 and/or any other example disclosed herein, for which the source assembly further includes a light source from a laser produced plasma.

Example 3 may include the measurement tool of example 1 and/or any other example disclosed herein, for which the CCD camera further includes a rolling shutter or global shutter.

Example 4 may include the measurement tool of example 1 and/or any other example disclosed herein, for which the CCD camera further includes a back-illuminated CMOS sensor and a rolling shutter.

Example 5 may include the measurement tool of example 1 and/or any other example disclosed herein, for which the projection optics system further includes a total magnification of approximately 600× to 1200×.

Example 6 may include the measurement tool of example 1 and/or any other example disclosed herein, further including the processor configured to determine the site specific best focus plane for each of the plurality of predetermined test sites on the patterned mask based on the best focus planes measurements for pre-selected calibration sites.

Example 7 provides a method for mask measurements including providing a EUV light source with a focal field, providing a detector assembly, providing a patterned mask on a stage, moving the stage to align the focal field with specific coordinates for a test site selected from a plurality of predetermined test sites, determining a best focus plane for the test site from a scan taken as the stage moves, for which the scan provides a continuous image output from the test site, moving the stage to a stationary position at the best focus plane, and obtaining an actinic critical dimension measurement at the test site by capturing a static image.

Example 8 may include the method for mask measurement of example 7 and/or any other example disclosed herein, further including generating an approximate best focus plane by obtaining best focus plane measurements of pre-selected calibration sites and setting a range of movement for the stage to encompass the approximate best focus plane.

Example 9 may include the method for mask measurement of example 8 and/or any other example disclosed herein, for which moving the stage is at a constant rate in a direction that is aligned with the EUV light source.

Example 10 may include the method for mask measurement of example 8 and/or any other example disclosed herein, for which the approximate best focus plane measurements for the pre-selected calibration sites are conducted on a separate measurement tool.

Example 11 may include the method for mask measurement of example 7 and/or any other example disclosed herein, for which the range of movement for the stage is a distance of approximately 200 nm Example 12 may include the method for mask measurement of example 9 and/or any other example disclosed herein, for which the constant movement for the stage is at a speed in the range of approximately 50 to 200 nanometer per second.

Example 13 may include the method for mask measurement of example 7 and/or any other example disclosed herein, further including performing the scan using a CMOS sensor with a rolling shutter.

Example 14 may include the method for mask measurement of example 13 and/or any other example disclosed herein, for which the rolling shutter captures images at a speed in the range of approximately 10 to 40 frames per second.

Example 15 may include the method for mask measurement of example 7 and/or any other example disclosed herein, further including performing the scan using a CMOS sensor with a global shutter.

Example 16 may include the method for mask measurement of example 7 and/or any other example disclosed herein, further including providing a processor configured to determine the best focus plane for the test sites on the patterned mask.

Example 17 provides an inspection method including providing a patterned mask on a movable stage, the patterned mask including a plurality of predetermined test sites and pre-selected calibration sites, generating best focus planes for the pre-selected calibration sites using a step and repeat scanning process, generating a site specific best focus plane for each of the plurality of predetermined test sites using a continuous scanning process that provides a continuous image output from the predetermined test site, and obtaining actinic critical dimension measurements at each of the plurality of predetermined test sites by capturing a static image using the site specific best focus plane for each of the plurality of predetermined test sites.

Example 18 may include the method for mask measurement of example 17 and/or any other example disclosed herein, for which the generating best focus planes for the pre-selected calibration sites using a step and repeat scanning process is performed on a critical dimension scanning electron microscope (CD-SEM) tool.

Example 19 may include the method for mask measurement of example 17 and/or any other example disclosed herein, for which the generating the site specific best focus plane for each of the plurality of predetermined test sites using a continuous scanning process is performed further includes using a CCD camera with a back-illuminated CMOS sensor and a rolling shutter and capturing images from the patterned mask moving on the stage.

Example 20 may include the method for mask measurement of example 17 and/or any other example disclosed herein, further including providing a processor configured to determine the site specific best focus plane for each of plurality of predetermined test sites on the patterned mask.

It will be understood that any property described herein for a specific device may also hold for any device described herein. It will also be understood that any property described herein for a specific method may hold for any of the methods described herein. Furthermore, it will be understood that for any device or method described herein, not necessarily all the components or operations described will be enclosed in the device or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the spirit and scope of the present disclosure as defined by the appended claims. The scope of the present disclosure is thus indicated by the appended claims and all changes which come within the meaning and range of equivalency of the claims are therefore intended to be embraced.

What is claimed is:

1. A measurement tool comprising:
    a source assembly configured to generate a high power extreme ultraviolet (EUV) light beam;
    a detector assembly comprising a projection optics system and a charge-coupled device (CCD) camera;
    a stage control system;
    a stage for supporting a patterned mask, the pattern mask comprising a plurality of predetermined test sites;
    a processor configured to:
    determine a site specific best focus plane for each of the plurality of predetermined test sites on the patterned mask based on best focus planes measurements for pre-selected calibration sites using a single scan that provides a continuous image output from the test site; and
    generate instructions to move the stage to the best focus plane for each of the plurality of predetermined test sites on the patterned mask to generate critical dimension data.

2. The measurement tool of claim 1, wherein the source assembly further comprises a light source from a laser produced plasma.

3. The measurement tool of claim 1, wherein the CCD camera further comprises a rolling shutter or global shutter.

4. The measurement tool of claim 1, wherein the CCD camera further comprises a back-illuminated complementary metal-oxide-semiconductor (CMOS) sensor and a rolling shutter.

5. The measurement tool of claim 1, wherein the projection optics system further comprises a total magnification of approximately 600× to 1200×.

6. A method for mask measurements comprising:
    providing an extreme ultraviolet (EUV) light source with a focal field;
    providing a detector assembly;
    providing a patterned mask on a stage;
    moving the stage to align the focal field with specific coordinates for a test site selected from a plurality of predetermined test sites;
    determining a best focus plane for the test site from a scan taken as the stage moves, wherein the scan provides a continuous image output from the test site;
    moving the stage to a stationary position at the best focus plane; and
    obtaining an actinic critical dimension measurement at the test site by capturing a static image.

7. The method for mask measurements in claim 6, further comprising:

generating an approximate best focus plane by obtaining best focus plane measurements of pre-selected calibration sites; and setting a range of movement for the stage to encompass the approximate best focus plane.

8. The method for mask measurements in claim 6, wherein moving the stage is moving the stage at a constant rate in a direction that is aligned with the EUV light source.

9. The method for mask measurements in claim 7, wherein the approximate best focus plane measurements for the pre-selected calibration sites are conducted on a separate measurement tool.

10. The method for mask measurements in claim 6, wherein the range of movement for the stage is a distance of approximately 200 nm.

11. The method for mask measurements in claim 8, wherein the constant movement for the stage is at a speed in the range of approximately 50 to 200 nanometer per second.

12. The method for mask measurements in claim 6, further comprising performing the scan using a CMOS sensor with a rolling shutter.

13. The method for mask measurements in claim 12, wherein the rolling shutter captures images at a speed in the range of approximately 10 to 40 frames per second.

14. The method for mask measurements in claim 6, further comprising performing the scan using a CMOS sensor with a global shutter.

15. The method for mask measurements in claim 6, further comprising providing a processor configured to determine the best focus plane for the test sites on the patterned mask.

16. An inspection method comprising:

providing a patterned mask on a movable stage, the patterned mask comprising a plurality of predetermined test sites and pre-selected calibration sites;

generating best focus planes for the pre-selected calibration sites using a step and repeat scanning process;

generating a site specific best focus plane for each of the plurality of predetermined test sites using a continuous scanning process that provides a continuous image output from the predetermined test site; and obtaining actinic critical dimension measurements at each of the plurality of predetermined test sites by capturing a static image using the site specific best focus plane for each of the plurality of predetermined test sites.

17. The inspection method of claim 16, wherein the generating best focus planes for the pre-selected calibration sites using a step and repeat scanning process is performed on a critical dimension scanning electron microscope tool.

18. The inspection method of claim 16, wherein the generating the site specific best focus plane for each of the plurality of predetermined test sites using a continuous scanning process is performed further comprises using a CCD camera with a back-illuminated CMOS sensor and a rolling shutter and capturing images from the patterned mask moving on the stage.

19. The method for mask measurements in claim 16, further comprising providing a processor configured to determine the site specific best focus plane for each of plurality of predetermined test sites on the patterned mask.

* * * * *